United States Patent
Sellers et al.

[11] Patent Number: 6,107,799
[45] Date of Patent: Aug. 22, 2000

[54] NOISE REDUCTION ARRANGEMENT FOR A MAGNETIC RESONANCE TOMOGRAPHY APPARATUS

[75] Inventors: Michael Sellers, Thakeham, United Kingdom; Johann Schuster, Oberasbach, Germany; Thomas Carlberger, Sjuntrop, Sweden; Franz Boemmel; Heinz Hentzelt, both of Erlangen, Germany; Ludwig Hartmann, Rieden, Germany

[73] Assignee: Siemens Aktiengesellschaft, Munich, Germany

[21] Appl. No.: 09/083,113

[22] Filed: May 22, 1998

[30] Foreign Application Priority Data

May 28, 1997 [DE] Germany ............... 197 22 481

[51] Int. Cl.[7] .................................................. G01V 3/00
[52] U.S. Cl. .......................................... 324/318; 324/322
[58] Field of Search ................. 324/318, 319, 324/320, 321, 322, 300, 306, 307, 309

[56] References Cited

U.S. PATENT DOCUMENTS

| | | | |
|---|---|---|---|
| 4,639,672 | 1/1987 | Beaumont | 324/318 |
| 5,235,283 | 8/1993 | Lehne et al. | 324/318 |
| 5,256,969 | 10/1993 | Miyajima et al. | 324/318 |
| 5,331,281 | 7/1994 | Otsuka | 324/318 |
| 5,345,177 | 9/1994 | Sato et al. | 324/318 |
| 5,698,980 | 12/1997 | Sellers et al. | 324/318 |
| 5,793,210 | 8/1998 | Pla et al. | 324/318 |

*Primary Examiner*—Louis Arana
*Attorney, Agent, or Firm*—Hill & Simpson

[57] ABSTRACT

A nuclear magnetic resonance tomography apparatus has a magnet assembly with a first surface and a gradient coil assembly with a second surface, with an annular gap between these surfaces. A noise-reduction arrangement for damping the oscillations of the gradient coil assembly and/or for stiffening the gradient coil assembly is disposed in this gap in contact with the first and second surfaces. The noise-reducing arrangement can be composed of one or more components, and has contact surfaces, formed by one or more components, respectively in substantially surface-wide contact with the first and second surfaces of the tomography apparatus.

11 Claims, 2 Drawing Sheets

NOISE REDUCTION ARRANGEMENT FOR A MAGNETIC RESONANCE TOMOGRAPHY APPARATUS

BACKGROUND OF THE INVENTION

1. Field of the Invention

The present invention is directed to a noise-reducing arrangement for a magnetic resonance tomography apparatus.

2. Description of the Prior Art

During operation of a nuclear magnetic resonance tomography apparatus, a magnet assembly generates a static basic field on the order of magnitude of approximately 1 Tesla. For imaging, it is necessary to superimpose magnetic field gradients on this basic field. This occurs with a gradient coil assembly that is arranged in the basic field. The gradient coil assembly usually includes a number of coils in order to generate three magnetic field gradients residing perpendicularly relative to one another.

Each gradient coil is typically permeated by a pulse-shaped current on the order of magnitude of up to 300 A with rise times of less than 1 ms. Lorentz forces that cyclically change according to the flow of current through the gradient coils thereby act on the conductors of the gradient coils in the basic magnetic field. These forces cause the gradient coil assembly to oscillate, causing a knocking noise unpleasant for the patient to arise, which can even reach the pain threshold in extreme cases.

U.S. Pat. No. 5,345,177 discloses a nuclear magnetic resonance tomograph of this type wherein a tubular gradient coil assembly has both ends connected to the inside wall of a cryostat by damping means. The damping means has one or two retainer pins that reside in essentially punctiform contact with the gradient coil assembly or the cryostat.

U.S. Pat. No. 5,256,969 discloses a gradient coil assembly having a specially stiffened and oscillation-damping coil body. Details as to the connection of the gradient coil assembly to a magnet assembly are not disclosed.

U.S. Pat. No. 5,331,281 discloses a gradient coil assembly whose natural frequency deviates from the frequency of a force acting on the assembly in order to reduce the creation of noise.

German OS 195 31 216 discloses a nuclear magnetic resonance tomography apparatus wherein the gradient coil assembly is elastically suspended in the region of a oscillation node to be expected during operation. The elastic suspension is relatively soft because it is intended to damp the transmission of oscillations of the coil assembly onto the magnet assembly. The oscillatory properties of the gradient coil assembly therefore are not modified significantly by the elastic suspension. A considerable noise level thus continues to occur during operation of this known tomography apparatus.

German PS 41 41 514 shows a gradient coil assembly with two shells that are concentric and connected to one another with a press fit. The assembly is especially rigid in mechanical terms, and as a result the sound pressure level in the examination space is reduced, however, this assembly is complicated to manufacture.

SUMMARY OF THE INVENTION

An object of the present invention is to provide a nuclear magnetic resonance tomography apparatus that, with low structural outlay, produces only low-level noise during operation.

The above object is achieved in accordance with the principles of the present invention in a nuclear magnetic resonance tomography apparatus having a magnet assembly with a first surface and a gradient coil assembly with a second surface, with a gap between these surfaces, and a noise-reduction arrangement disposed in this gap for damping the oscillations of the gradient coil assembly and/or for stiffening the gradient coil assembly, the noise-reduction arrangement being composed of one or more components, and having contact surfaces, formed by one or more of these components, respectively and substantially surface-wide contact with the first and second surfaces of the tomography apparatus.

As used herein, "surface-wide contact" means a wide-area region of contact between the contact surfaces of the noise-reduction arrangement and the respective first and second surfaces of the gap in which the noise-reduction arrangement is disposed. This is to be distinguished from the punctiform or localized contact or attachment which has heretofore been conventional in noise-reducing structures employed in magnetic resonance tomography.

As used herein "a stiffening of the gradient coil assembly" means both a stiffening of the overall assembly as well as a local stiffening of individual regions of this assembly.

For oscillation damping and/or for stiffening the gradient coil assembly, the invention is based on the consideration of supporting this at the magnet assembly in a suitable way. To that end, noise-reduction means are provided either in planar contact with the magnet assembly and the gradient coil assembly, or wedges are wedged in between the two surfaces in order to reduce the noise arising during operation of the tomography apparatus.

The inventive solution is very economical because components of the magnet assembly (for example, the extremely stable inside magnet tube composed of approximately 4 mm thick stainless steel) are put to use for the noise reduction. Further, surprisingly high noise reductions of up to 10 dB are achieved by the invention.

Inventively, the noise-reduction means serves for oscillation damping and/or stiffening the gradient coil assembly. Dependent on the structure and the material of the noise-reduction means, these two functions are realized to different extents, with an exact separation of the action principles often not being possible. The noise-reduction means thus produces a combined oscillation damping/stiffening effect which, dependent on the structure and material of the noise-reduction means, can range from primarily oscillation dampening with little stiffening to primarily stiffening, with little oscillation damping. As a rule, however, the oscillation-damping properties produce a more effective noise reduction than the stiffening properties.

When, for example, the space between the first and the second surface is filled with a fluid (for example, water and/or oil), the noise-reduction means formed in this way has primarily stiffening properties and only minimal noise-reducing properties. Air-filled expanded cellular material that is clamped between the first and the second surfaces, by contrast, has mainly an oscillation-damping effect and produces only a slight degree of stiffening. Given a sand fill, the relationship of damping and stiffening is roughly balanced. The noise-reduction means, further, can include a foam, air, some other gas or other substances for oscillation damping and/or stiffening. All of these substances can be pressurized.

The functional principle of the noise-reduction means in view of its oscillationdamping effect is that the oscillatory energy of the gradient coil assembly, which is present as structurally transmitted sound on the second surface, is introduced into a damping layer and is largely absorbed therein by the oscillatory energy being converted into work in the damping layer (and, thus, into heat). As a result thereof, the vibrations and the sound emission of the gradient coil assembly are reduced.

In view of its stiffening properties, the effect of the noise-reduction means is based on the fact that the overall deformation of the gradient coil assembly, and thus the noise emission as well, are reduced with increasing stiffness. Due to a stiffening of the coil assembly, moreover, the natural resonant self-oscillation behavior thereof is tuned to higher frequencies that can in turn be more easily damped.

The noise-reduction means is especially effective when it is in substantially surface-wide contact with the first and second surfaces. This is particularly the case when the space between these two surfaces is essentially completely filled by the noise-reduction means. An additional noise-alleviating effect then arises because the air gap between the magnet assembly and the gradient coil assembly, which normally intensifies and transmits the noise caused by the oscillation of the gradient coil assembly, loses its properties as a resonant space and sound transmitter. The spacing between the first and the second surfaces is preferably substantially uniform and can amount to approximately 2 mm through 20 mm.

In an embodiment of the invention, liquid, gaseous or bulk insulation materials, in particular, are arranged directly, i.e. without a further envelope or container, in a sealed space limited by the first and second surface. As an alternative embodiment, these or other substances can be surrounded with a suitable, preferably flexible sheath, bag, etc.

The noise-reduction means is preferably formed of at least one pillow or cushion. Such a pillow preferably has a covering and a core or a fill; however, it can also be composed of a uniform layer of a suitable material (particularly expanded cellular material) or of a number of layers of different materials. In order to achieve an especially good sound-insulating effect, the pillow is preferably elastic and/or resilient and/or flexible. In the operating condition of the tomography apparatus, the pillow preferably lies directly against the first and the second surface but is not firmly joined thereto. As a result, the gradient coil assembly can be more easily disassembled for maintenance or for replacement.

The pillow preferably has an air-impermeable outside skin formed of bonded plastic film. The outside skin is preferably composed of PVC film, of polyethylene film or some other film that is airtight and bondable. An expanded cellular material fill composed of an open-celled expanded cellular material, for example polyurethane foam, is preferably contained in the pillow. The expanded cellular material fill produces a good sound insulation and also gives an adequate elasticity to the pillow when the air pressure in the inside of the pillow is approximately the same as the ambient air pressure.

The pillow preferably has a connection that can be fashioned as a valve. When the pillow is not introduced into the tomography apparatus and the valve is opened, the pillow is preferably thicker than the spacing between the first and second surfaces. When this pillow, with the valve open, is introduced into the tomography apparatus, then the expanded cellular material fill presses its outside skin against the first and the second surfaces, causing the gap between these surfaces to be completely filled.

A pillow with airtight outside skin and expanded cellular material fill can be easily inserted into the gap between the first and the second surfaces and removed therefrom when the air contained in the pillow is pumped out to such an extent that it is compressed by the ambient air pressure to form a thinner configuration.

In another embodiment of the invention, the noise-reduction means is formed by wedges that are wedged in between the first and the second surfaces. This embodiment produces an especially strong stiffening effect. The radial stiffness of the gradient coil assembly is locally increased in the environment of the wedge by each wedge. In a very effective sound-reduction means, stiffening wedges are combined with other, oscillation-damping means.

Preferably, the wedges are clamped at regions of the gradient coil assembly that exhibit high oscillatory amplitudes (oscillation bellies) during operation of the tomograph. When the excursion at these or other regions is locally reduced by the wedges, then the deformation and oscillation of the overall coil assembly and, accordingly, noise creation are also correspondingly reduced. At least some of the wedges preferably lie planarly against the first and the second surfaces. The size of the seating surfaces is preferably adapted to the static load.

Given tomography systems with a tubular gradient coil assembly, wedges are preferably provided and the end faces of this assembly because the oscillatory amplitudes are greatest there in a multitude of oscillatory modes. An additional wedge arrangement along a circumferential line and disposed approximately in the axial middle of the tubular gradient coil assembly is advantageous.

In a preferred embodiment, the wedges given a tubular gradient coil assembly should mainly increase the stiffness thereof in the circumferential direction. To this end, a relatively large number of wedges are respectively arranged along one or more circumferential lines. When, for example, a hexagonal deformation pattern arises in a cross-sectional plane through the coil assembly during operation of the tomography apparatus, preferably at least six wedges are wedged in at the locations of maximum excursion along the outside circumferential line defined by this cross-sectional plane. The stiffening effect can be improved further by using at least ten, preferably eleven or twelve wedges, along a circumferential line.

A noise-reduction means for a tubular gradient coil assembly constructed with wedges or other stiffening means is preferably fashioned such that the natural resonant frequencies of the gradient coil assembly are detuned relative to one another in the circumferential and longitudinal (axial) directions. This is particularly possible when the noise-reduction means changes the stiffness of the coil assembly in a different way in the circumferential and longitudinal directions. For example, wedges that are inserted along a circumferential line of the gradient coil assembly mainly increase the stiffness of the coil assembly in the circumferential direction, causing the natural resonant frequency of the assembly to be increased in this direction. A detuning of the oscillatory frequencies is advantageous because the superimposition (interference) of standing waves with high energy contents is thereby avoided. Such an interference would result in an increased acoustic pressure level within the inside tube of the gradient coil assembly (patient tube).

DESCRIPTION OF THE PREFERRED EMBODIMENTS

Figure 1:
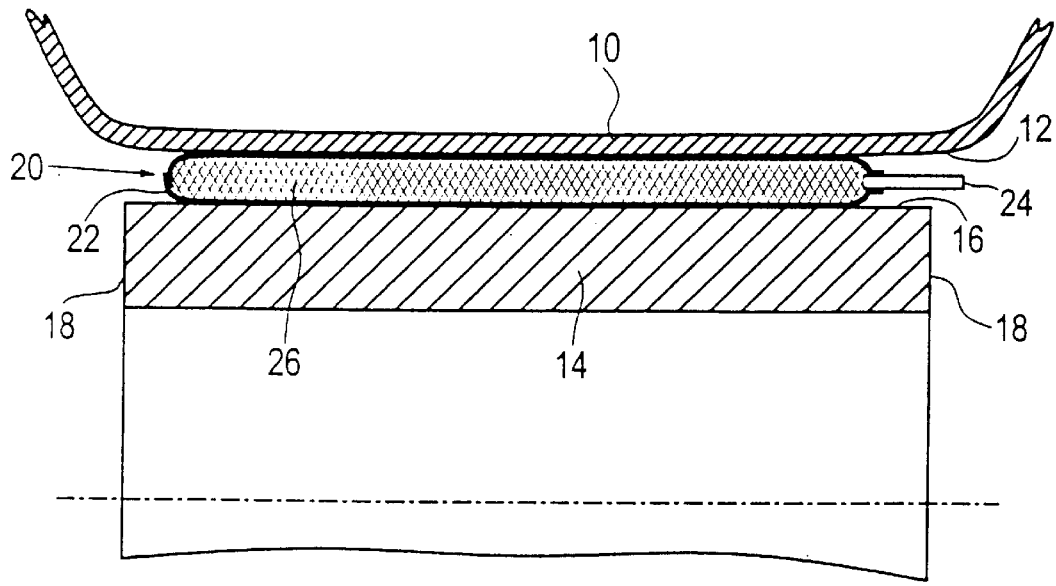
FIG. 1 is a side sectional view of a portion of a magnetic resonance tomography apparatus and a first embodiment of a noise-reduction arrangement constructed in accordance with the principles of the present invention.

The nuclear magnetic resonance tomography apparatus according to FIGS. 1 through 4 is provided for whole body examinations. The apparatus has a magnet assembly 10 which generates a uniform, static basic magnetic field in an examination volume. The magnet assembly 10 is limited by a first surface 12 facing toward the examination volume. In FIGS. 1 through 4, an inside magnet tube (patient tube) with a circular cross-section, whose inside surface forms the first surface 12 is shown as the only component of the magnet assembly. The inside magnet tube is composed of stainless steel with a thickness of approximately 4 mm, and separates the basic field magnet, and the cryostat in which it is contained, from the patient.

A gradient coil assembly 14 is arranged in the basic magnetic field of the magnet assembly 10 and is capable of generating three magnetic field gradients arranged at right angles relative to one another. Corresponding to the shape of the inside magnet tube, the gradient coil assembly 14 is fashioned as tube with a circular cross-section. The outside surface of the gradient coil assembly 14 forms a second surface 16 that faces toward the first surface 12. The gradient coil assembly 14 is concentrically secured in the magnet assembly 10, so that a uniform gap, annular in cross-section having a width of about 6 mm is formed between the first surface 12 and the second surface 16. At each of its two ends, the gradient coil assembly 14 has an annular end face 18. The longitudinal axis of the gradient coil assembly 14 is indicated as a dotdash line in FIGS. 1 through 4.

In each of FIGS. 1 through 4, a noise-reduction means is arranged in contact with the first surface 12 and with the second surface 16.

In the exemplary embodiment of FIG. 1, which is currently considered as the best way of implementing the invention, the noise-reduction means is formed by a number of pillows 20 that are introduced into the space between the first surface 12 and the second surface 16. Only one of these pillows 20 is shown in FIG. 1, the others being distributed circumferentially around the annular space.

Each pillow 20 has an airtight outside skin 22 that is composed of two pieces of PVC film bonded to one another. A connection 24 fashioned as valve is inserted airtight at a location of the circumferential weld (seam). The outside skin 22 surrounds an expanded cellular material fill 26 formed of an open-celled polyurethane foam that is planarly glued to the outside skin 22.

The valve is opened in the operating condition of the tomography apparatus, so that ambient air pressure approximately prevails in the inside of the pillow 20. The pillow 20 is dimensioned such (in this state) that the outside skin 22 is pressed against the first surface 12 and the second surface 16 by the expanded cellular material fill 26. The gap between the two surfaces 12 and 16 is completely filled, and oscillation of the gradient coil assembly 14 is effectively damped.

When the pillow 20 is to be removed for maintenance of the tomography apparatus, for cleaning or for some other reasons, air is pumped out of the pillow 20 via the connector 24. The ambient air pressure now compresses the pillow 20, so that it can be easily removed from the gap between the two surfaces 12 and 16. The pillow 20 can be stored in this evacuated condition with the valve closed. Since it is thin and relatively stiff in this condition, it can be reinserted relatively easily between the two surfaces 12 and 16 after the end of the work, whereby it follows the curvature of these surfaces. When the valve is then opened, air flows into the pillow 20 and the pillow 20 re-assumes its original elasticity and thickness and is thereby held in a clamp fit between the two surfaces 12 and 16.

In an alternative version of the embodiment of the noise-reduction means according to FIG. 1, the pillow 20 can be pumped up to a slight excess pressure and/or can be filled with a different gas or a fluid and/or the inner expanded cellular material fill 26 can be omitted.

Figure 2:
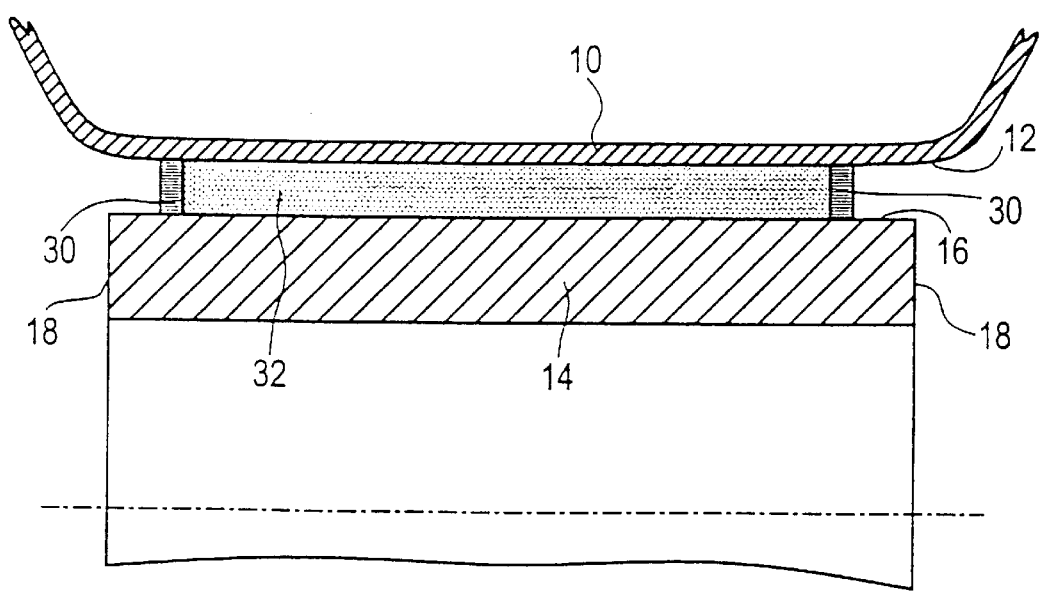
FIG. 2 is a side sectional view of a portion of a magnetic resonance tomography apparatus and a second embodiment of a noise-reduction arrangement constructed in accordance with the principles of the present invention.

According to the exemplary embodiment of FIG. 2, the noise-reduction means is formed by a sealed space in the cylindrical gap between the magnet assembly 10 and the gradient coil assembly 14, this sealed space being limited by the first surface 12, the second surface 16 and two annular seals 30. The space formed in this way is filled with sand 32. The seals 30 are designed as rubber seals and are arranged close to the end faces 18 of the gradient coil assembly 14. Such a noise-reduction means exhibits good oscillation damping and good stiffening properties.

In an alternative version of the embodiment of FIG. 2, some other oscillationdamping and/or stiffening material, for example a foam or a pressurized fluid, can be provided instead of sand 32.

Figure 3:
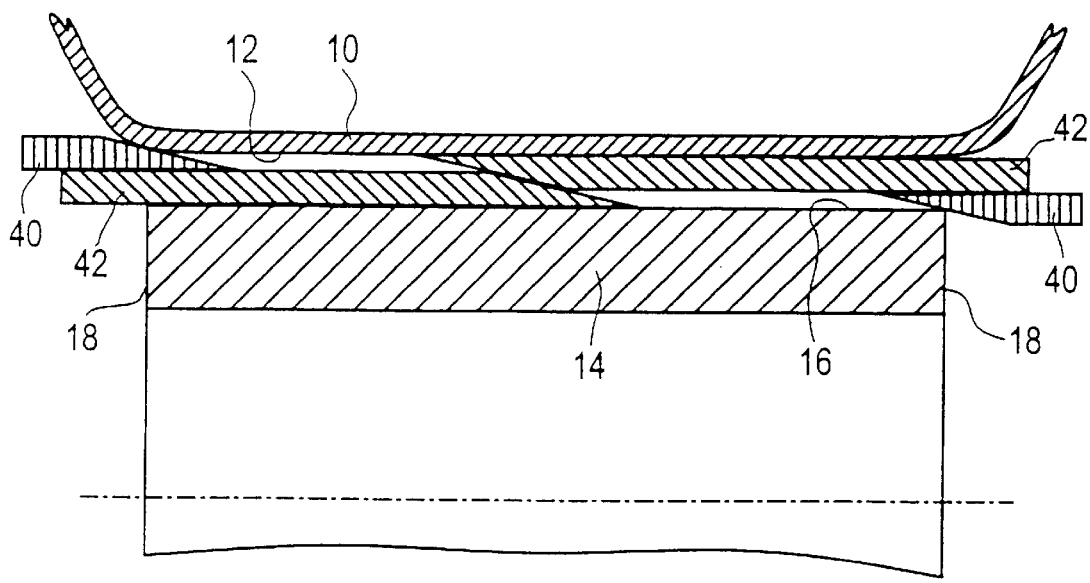
FIG. 3 is a side sectional view of a portion of a magnetic resonance tomography apparatus and a third embodiment of a noise-reduction arrangement constructed in accordance with the principles of the present invention.

In the exemplary embodiment shown in FIG. 3, the noise-reduction means is formed by short wedges 40 and long wedges 42 that support the gradient coil assembly 14 against the inside magnet tube and thus stiffen it. The wedges 40 and 42 are composed of a stable and oscillation-damping material, for example wood or an injection molded plastic part.

Eleven short wedges 40 are inserted at the two end faces 18 at uniform angular spacings around the outside circumference of the gradient coil assembly 14. Further, the gradient coil assembly 14 is supported by eleven pairs of long wedges along a circumferential line proceeding in the middle between the two end faces 18. The wedges 40 and 42 project somewhat beyond the end faces 18 so that they can be removed given maintenance work.

In an alternative version of the embodiment of FIG. 3, more or fewer wedges 40 and/or 42 can be provided along each circumferential line, or the wedges 40 and 42 can be arranged at more or fewer than three circumferential lines. An irregular distribution of the wedges 40 and 42 is also possible.

Figure 4:
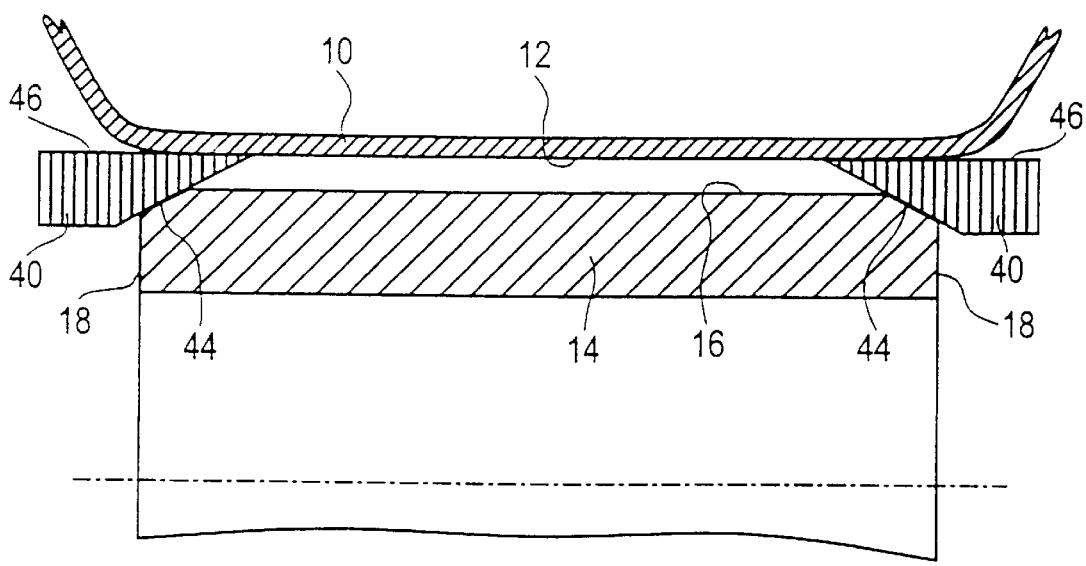
FIG. 4 is a side sectional view of a portion of a magnetic resonance tomography apparatus and a fourth embodiment of a noise-reduction arrangement constructed in accordance with the principles of the present invention.

FIG. 4 shows an exemplary embodiment modified compared to FIG. 3 wherein only short wedges are clamped at the end faces 18 between the magnet assembly 10 and the gradient coil assembly 14. A planar, slanting seating surface 44 against which the slanted region of the wedge 40 planarly lies is provided for each wedge 40 at the second surface 16 of the gradient coil assembly. The surface 46 of each wedge 40 shown at the top in FIG. 4 is curved corresponding to the curvature of the first surface 12, so that each wedge 40 also lies planarly against the inside magnet tube.

In an alternative version of the embodiment of FIG. 4, the first surface 12 can have planar seating regions, or the wedges 40 can be curved at their slanting region corresponding to the curve of the second surface 16.

Although modifications and changes may be suggested by those skilled in the art, it is the intention of the inventors to embody within the patent warranted hereon all changes and modifications as reasonably and properly come within the scope of their contribution to the art.

We claim as our invention:

1. A nuclear magnetic resonance tomography apparatus comprising:

a magnet assembly with a first surface;

a gradient coil assembly with a second surface, said first and second surfaces being disposed facing each other and spaced from each other with a gap therebetween; and a noise-reduction arrangement comprising a pillow disposed in said gap for producing a combined effect of damping oscillations of said gradient coil assembly and stiffening said gradient coil assembly, said pillow having contact surfaces respectively in a wide-area contact with said first and second surfaces and containing a material selected from the group consisting of foam, expanded cellular material, a fluid, a gas, and sand, and said pillow comprising an exterior skin impermeable to said material.

2. A nuclear magnetic resonance tomography apparatus as claimed in claim 1 wherein said pillow has an air-impermeable exterior skin, filled with open-cell expanded cellular material.

3. A nuclear magnetic resonance tomography apparatus as claimed in claim 2 wherein said pillow has a valve in said exterior skin allowing air to flow into and out of said pillow.

4. A nuclear magnetic resonance tomography apparatus as claimed in claim 1 wherein said magnet assembly has a magnet tube and wherein said first surface comprises an interior surface of said magnet tube, and wherein said gradient coil has a tubular shape and wherein said second surface comprises an exterior of said gradient coil assembly, and wherein said gap comprises an annular gap.

5. A nuclear magnetic resonance tomography apparatus comprising:

a magnet assembly having a first surface;

a tubular gradient coil assembly exhibiting natural resonant frequencies and being subject to oscillation at said natural resonant frequencies during operation thereof, said gradient coil assembly having a second surface extending in a circumferential direction and a longitudinal direction, said first and second surfaces being disposed facing toward each other and spaced from each other with a gap therebetween; and noise-reduction means in contact with said gradient coil assembly for detuning said natural resonant frequencies of said gradient coil assembly relative to each other in both said circumferential direction and said longitudinal direction by producing a combined effect of damping oscillations of said gradient coil assembly and stiffening said gradient coil assembly, said noise-reduction means being disposed in contact with said first and second surfaces and comprising a plurality of wedges in said gap between said first and second surfaces.

6. A magnetic resonance tomography apparatus as claimed in claim 5 wherein said second surface comprises an exterior of said gradient coil assembly, and wherein said gap comprises an annular gap.

7. A magnetic resonance tomography apparatus as claimed in claim 6 wherein said noise-reduction means comprises at least six wedges wedged around at least one circumferential line of said gradient coil assembly.

8. A magnetic resonance tomography apparatus as claimed in claim 7 wherein said noise-reduction means comprises at least ten wedges wedged around at least one circumferential line of said gradient coil assembly.

9. A magnetic resonance tomography apparatus as claimed in claim 5 wherein said wedges are disposed at at least three axially offset locations of said gradient coil assembly.

10. A magnetic resonance tomography apparatus as claimed in claim 9 wherein said gradient coil assembly has two opposite end faces, and wherein said wedges are disposed respectively at said two end faces and in a central location between said two end faces.

11. A magnetic resonance tomography apparatus as claimed in claim 5 wherein at least one of said wedges is disposed planarly against said first and second surfaces.

\* \* \* \* \*